US006919748B2

(12) United States Patent
Lee et al.

(10) Patent No.: US 6,919,748 B2
(45) Date of Patent: Jul. 19, 2005

(54) DIELECTRIC LAMINATED FILTER

(75) Inventors: Byoung Hwa Lee, Kyungki-do (KR); Nam Chul Kim, Daejeon (KR); Jeong Ho Yoon, Seoul (KR); Sang Soo Park, Kyungki-do (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 117 days.

(21) Appl. No.: 10/377,722

(22) Filed: Mar. 4, 2003

(65) Prior Publication Data

US 2003/0201847 A1 Oct. 30, 2003

(30) Foreign Application Priority Data

Apr. 25, 2002 (KR) ........................................ 2002-22642

(51) Int. Cl.[7] ............................ H03H 7/01; H01P 1/203
(52) U.S. Cl. ........................ 327/204; 327/202; 327/175
(58) Field of Search ................................ 333/202, 204, 333/185, 219, 175

(56) References Cited

U.S. PATENT DOCUMENTS 6,294,967 B1 9/2001 Hirai et al. ................. 332/202
6,492,886 B1 * 12/2002 Kushitani et al. ........... 333/204
6,791,435 B2 * 9/2004 Shingaki et al. ............ 333/175

FOREIGN PATENT DOCUMENTS

DE 43 42 818 6/1994
JP 2001-053571 2/2001

OTHER PUBLICATIONS

Patent Abstracts of Japan –Publication No. 09–246805, Published Sep. 19, 1997.
Patent Abstracts of Japan –Publication No. 08–070201, Published Mar. 12, 1996.
Patent Abstracts of Japan –Publication No. 2000–091807, Published Mar. 31, 2000.

* cited by examiner

*Primary Examiner*—Dinh T. Le
(74) *Attorney, Agent, or Firm*—Lowe Hauptman & Berner, LLP

(57) ABSTRACT

An dielectric laminated filter improves a skirt characteristic to shift am attenuation pole to a transmitting frequency band while maintaining the same band width of the transmitting frequency band and includes a dielectric block laminated with a plurality of dielectric sheets, ground electrodes formed on front and rear sides of the dielectric block, input and output electrodes formed on both sides of the dielectric body to be separated from the ground electrodes, an inductor pattern having two portions disposed parallel to the resonator patterns coupled to the input and output electrodes and a connecting portion coupling the two portions to induce an inductance coupling with the resonator patterns coupled to the input and output electrodes to improve a filter response characteristic by adjusting the inductance coupling.

36 Claims, 18 Drawing Sheets

DIELECTRIC LAMINATED FILTER

CROSS-REFERENCE TO RELATED APPLICATION

This application claims to benefit of Korean Patent Application No. 2002-22642, filed Apr. 25, 2002, in the Korean Intellectual Property Office, the disclosure of which is incorporated herein by reference.

BACKGROUND OF THE INVENTION

1. Field of the Invention

The present invention relates to a dielectric laminated filter, and more particularly, to a dielectric laminated filer able to improve a skirt characteristic of a resonance frequency by controlling a location of a resonating point generating according to an electronic combination between resonators.

2. Description of the Related Art

According to a recent development of a radio wave technology, demands of wireless communication equipment or mobile telecommunication terminal increase. A characteristic of these wireless apparatus depends on a filtering characteristic of a filter used in the wireless apparatus.

The filter used for filtering a radio wave is classified into one of a saw filter and a dielectric filter. Although the saw filter is small in volume, a cost is high, and it is very difficult to be realized in a high frequency beyond an S band whereas the dielectric filter is too bulky in volume although the cost is low.

The dielectric filter is classified into one of a bulk type dielectric filter and a laminated type dielectric filter. The bulky type dielectric filter, which has been widely used, cannot be used in a minimized telecommunication apparatus. In the laminated type dielectric filter, an attenuation characteristic is lowered in a frequency near a transmissive band compared to the saw filter and the bulk type dielectric filter. However, the laminated type dielectric filter has been developed to have an excellent filtering function, be minimized, and become lightweight since the laminated type dielectric filter has an excellent spurious characteristic and is small in volume.

FIG. 1 is a perspective view of a conventional dielectric laminated filter 1. Referring to FIG. 1, the dielectric laminated filter 1 includes a dielectric block 2 having a hexahedron and laminated with a plurality of dielectric sheets, input and output electrodes 3, 4 formed on first opposite sides of the dielectric body 2, and ground electrodes 5*a,* 5*b* formed on second opposite sides of the dielectric body 2.

The dielectric block 2 is made of the dielectric sheets which are laminated, various patterns are formed on respective dielectric sheets. FIGS. 2A and 2B are cross-sectional views taken along lines A—A and B—B of FIG. 1, respectively, to show pattern arrangements of the dielectric sheets of the dielectric block.

As shown in FIGS. 2A and 2B, the dielectric laminated filter 1 includes ground patterns 6*a,* 6*b* coupled to the ground electrodes 5*a,* 5*b,* resonator patterns 9 disposed between the ground patterns 6*a,* 6*b,* having one end coupled to the ground electrode 5*a,* and disposed parallel to one another in a plane, and input and output patterns 10 to which two of the resonator patterns 9 disposed on both sides of the plane are coupled, respectively. A plurality of load capacitor patterns 7, 8 are arranged to be parallel to the resonator patterns 9 between the resonator patterns 9 and the ground patterns 6*a,* 6*b*. The load capacitor patterns 7, 8 are coupled to the ground pattern 5*b* at their end. The respective patterns are formed to be spaced-apart from each other by a predetermined distance, and a dielectric material is filled in spaces between the respective patterns.

FIG. 3 is an exploded view of pattern structures of the dielectric laminated filter shown in FIG. 1, and FIG. 4 is an equivalent circuit diagram of the dielectric laminated filter shown in FIG. 1. Referring to FIGS. 3 and 4, the resonator patterns 9 (9*a,* 9*b,* 9*c*) form resonators R1, R2, R3 coupled to a ground at their one end, and the load capacitor patterns 7, 8 disposed above and below the resonator patterns 9 and parallel to the resonator patterns 9 form load capacitors CR1, CR2, CR3, coupled to resonators R1, R2, R3 to be parallel to the resonators R1, R2, R3. Respective electronic couplings between input and output electrodes 3, 4 and the resonator patterns 9 and between the resonator patterns 9 form a plurality of inductance couplings L01, L02, L03, L04 to show an equivalent characteristic of the equivalent circuit shown in FIG. 4.

In the dielectric laminated filter 1 having the above structure, a location of a resonating point of the dielectric body 2 is determined according to the load capacitors CR1, CR2, CR3 and the resonators R1, R2, R3, the dielectric body has a transmissive characteristic on signals of a predetermined frequency band based on the resonating point.

However, a response characteristic of the above structure of the dielectric laminated filter 1 shows that a skirt characteristic of a high frequency portion (a right side) of the predetermined frequency band deteriorates.

In order to improve the skirt characteristic of the dielectric laminated filter or adjust the skirt characteristic according to a user demand, the number of the resonators is increased according to an increase of the number of filter sections, or a method of forming an attenuation pole near the transmitting frequency band.

If the number of the resonators is increased, an insertion loss occurs due to an increased number of the resonators, and it is limited to increase the number of the filter sections within a limited size of the dielectric body.

Although the method of forming the attenuation pole near the transmitting frequency band may increase the skirt characteristic without the increase of the number of the filter sections, an additional circuit is required to form the attenuation pole, thereby causing a filter circuit to be complicated.

In addition, if the dielectric laminated filter is minimized, a coupling generated between circuit patterns inserted into the dielectric body to form the attenuation pole is generated to distort a filter characteristic of the dielectric laminated filter.

SUMMARY OF THE INVENTION

To solve the above and/or other problems, it is an aspect of the present invention to provide a dielectric laminated filter able to improve a skirt characteristic by forming loop-type conductive patterns above, below, or top and bottom sides of a resonator of a dielectric body to form an attenuation pole near a transmitting frequency band while maintaining a band width of the transmitting frequency band.

Additional aspects and advantageous of the invention will be set forth in part in the description which follows and, in part, will be obvious from the description, or may be learned by practice of the invention.

To achieve the above and/or other aspects of the present invention, a dielectric laminated filter includes a dielectric block laminated with a plurality of dielectric sheets, a plurality of ground electrodes formed on first sides of the dielectric block, a plurality of input and output electrodes formed on second sides of the dielectric body to be separated from the ground electrodes, a plurality of internal ground patterns each formed on an internal dielectric sheet of the dielectric block and coupled to the ground electrodes, a plurality of resonator patterns disposed between the third sides of the dielectric block and having ends coupled to one of the ground electrodes, and an inductor pattern disposed to be spaced-apart from the resonator patterns, having a closed loop having at least one internal space, and forming an inductance coupling between the resonator patterns.

According to another aspect of the present invention, the resonator patterns are disposed on the same plane.

According to another aspect of the present invention, at least one of the resonator patterns is disposed on a first plane, and the other one of the resonator patterns is disposed on a second plane different from the first plane.

According to another aspect of the present invention, the resonator patterns are parallel to each other.

According to another aspect of the present invention, two of the resonator patterns are disposed adjacent to the input and output electrodes and comprises portions coupled to corresponding ones of the input and output electrodes.

According to another aspect of the present invention, the dielectric block includes a plurality of capacitor patterns disposed above and under the resonator patterns to be coupled to the ground electrodes.

According to another aspect of the present invention, the capacitor pattern includes first capacitor patterns disposed on the same plane above the resonator patterns and the second capacitor patterns disposed on the same plane under the resonator patterns.

According to another aspect of the present invention, one of the capacitor patterns is disposed on a first plane while the other one of the capacitor patterns is disposed on a second plane different from the first plane.

According to another aspect of the present invention, the number of the capacitor patterns disposed above or under the resonator patterns is the same as the number of the resonator patterns.

According to another aspect of the present invention, the capacitor patterns are disposed to be parallel to each other.

According to another aspect of the present invention, at least one of the capacitor patterns is disposed on a line one that the resonator patterns is disposed.

According to another aspect of the present invention, the inductor pattern is disposed under the resonator patterns.

According to another aspect of the present invention, the inductor pattern is disposed above the resonator patterns.

According to another aspect of the present invention, the inductor pattern is disposed above and under the resonators.

According to another aspect of the present invention, the inductor pattern is disposed between the capacitor patterns and the internal ground patterns.

According to another aspect of the present invention, the inductor pattern is disposed on a plane on which the resonator patterns are disposed.

According to another aspect of the present invention, the inductor pattern is disposed between the resonator patterns corresponding to the input and output electrodes.

According to another aspect of the present invention, the dielectric block includes a plurality of impedance patterns disposed on a plane on which the capacitor patterns and the resonator patterns are not disposed, disposed to correspond to input and output electrodes, and having first ends coupled to one of the ground electrodes and second ends coupled to the input and output electrodes, respectively.

According to another aspect of the present invention, the impedance pattern is disposed between the internal ground patterns and the capacitor patterns.

According to another aspect of the present invention, the inductor pattern has a rectangular loop shape.

According to another aspect of the present invention, the inductor pattern has a checkered shape having a plurality of inside spaces.

According to another aspect of the present invention, the inductor pattern has a circular closed loop shape.

According to another aspect of the present invention, the inductor pattern has a shape of θ.

According to another aspect of the present invention, the inductor pattern has an area and a length, the inductor pattern generates an inductance coupling with the resonator patterns coupled to the input and output electrodes, and the inductance coupling varies according to the area and the length of the inductor pattern.

To achieve the above and/or other aspects of the present invention, a dielectric laminated filter includes a dielectric block laminated with a plurality of dielectric sheets, a plurality of ground electrodes formed on first sides of the dielectric block, a plurality of input and output electrodes formed on second sides of the dielectric body to be separated from the ground electrodes, a plurality of internal ground patterns each formed on an inside portion of third sides of the dielectric block and coupled to the ground electrodes; a plurality of resonator patterns disposed between the third sides of the dielectric block and having ends coupled to one of the ground electrodes, a plurality of capacitor patterns disposed above/below the resonator patterns and having ends coupled to the input and output electrodes, and an inductor pattern disposed to be spaced-apart from the resonator patterns, having a shape of ⊓, having ends of the ⊓ shape coupled the ground electrodes to form a closed loop to form an inductance coupling with the resonator patterns.

To achieve the above and/or other aspects of the present invention, a dielectric laminated filter includes a dielectric block laminated with a plurality of dielectric sheets, a plurality of ground electrodes formed on first sides of the dielectric block, a plurality of input and output electrodes formed on second sides of the dielectric body to be separated from the ground electrodes, a plurality of internal ground patterns each formed on an inside portion of third sides of the dielectric block and coupled to the ground electrodes, a plurality of resonator patterns disposed between the third sides of the dielectric block and having ends coupled to one of the ground electrodes, a plurality of capacitor patterns disposed on a plane between the resonator patterns and one of the internal ground patterns, having ends coupled to the input and output electrodes, having the same number of the resonator patterns, and spaced-apart from the resonator patterns, and an inductor pattern disposed on one of the dielectric sheets on which the resonator patterns or the capacitor patterns are disposed, having a closed loop to form an inductance coupling with the resonator patterns.

To achieve the above and/or other aspects of the present invention, a dielectric laminated filter includes a dielectric block laminated with a plurality of dielectric sheets, a plurality of ground electrodes formed on first sides of the dielectric block, a plurality of input and output electrodes formed on second sides of the dielectric body to be separated from the ground electrodes, a plurality of internal ground patterns each formed on an inside portion of third sides of the dielectric block and coupled to the ground electrodes, a plurality of resonator patterns disposed between the third sides of the dielectric block and having ends coupled to one of the ground electrodes, a plurality of capacitor patterns disposed on a plane between the resonator patterns and one of the internal ground patterns, having ends coupled to the input and output electrodes, having the same number of the resonator patterns, and spaced-apart from the resonator patterns, and an inductor pattern disposed on one of the dielectric sheets on which the resonator patterns or the capacitor patterns are disposed, disposed between the resonator patterns disposed adjacent to the input and output electrodes, spaced-apart from the resonator patterns by a distance, and having a closed loop to form an inductance coupling with the resonator patterns.

To achieve the above and/or other aspects of the present invention, a dielectric laminated filter includes a dielectric block laminated with a plurality of dielectric sheets, a plurality of ground electrodes formed on first sides of the dielectric block, a plurality of input and output electrodes formed on second sides of the dielectric body to be separated from the ground electrodes, a plurality of internal ground patterns each formed on an inside portion of third sides of the dielectric block and coupled to the ground electrodes, a plurality of resonator patterns disposed between the third sides of the dielectric block and having ends coupled to one of the ground electrodes, a plurality of capacitor patterns disposed on a plane between the resonator patterns and one of the internal ground patterns, having ends coupled to the input and output electrodes, having the same number of the resonator patterns, and spaced-apart from the resonator patterns, an impedance transformer disposed on one of the dielectric sheets disposed between the capacitor patterns and one of the internal ground patterns, having two sub-patterns disposed adjacent to the input and output electrodes and having first ends coupled to one of the ground electrodes and second ends coupled to the input and output electrodes, and an inductor pattern disposed on one of the dielectric sheets on which the resonator patterns or the capacitor patterns are disposed, disposed between the resonator patterns disposed adjacent to the input and output electrodes, spaced-apart from the resonator patterns by a distance, and having a closed loop to form an inductance coupling with the resonator patterns.

To achieve the above and/or other aspects of the present invention, a dielectric laminated filter includes a dielectric block having a first plurality of ground electrodes, a plurality of input and output electrodes, and a ground dielectric sheet formed with an internal ground pattern coupled to the ground electrodes, a resonator dielectric sheet formed with resonator patterns coupled to the input and output electrodes, a capacitor dielectric sheet disposed between the resonator dielectric sheet and the ground dielectric sheet and formed with capacitor patterns coupled to the ground electrodes, and an inductor dielectric sheet formed with an inductor pattern forming an inductance coupling between the resonator patterns.

To achieve the above and/or other aspects of the present invention, a dielectric laminated filter includes a dielectric block having a first plurality of ground electrodes, a plurality of input and output electrodes, and a ground dielectric sheet formed with an internal ground pattern coupled to the ground electrodes, a resonator dielectric sheet formed with resonator patterns corresponding to resonators coupled between the input and output electrodes and the internal ground patterns, and an inductor dielectric sheet formed with an inductor pattern corresponding to an inductor coupled between a first junction between the input electrode and one of the resonator patterns and a second junction between the output electrode and the other one of the resonator patterns to form an inductance coupling with the resonator patterns.

According to another aspect of the present invention, the dielectric block includes a capacitor dielectric sheet is formed with capacitor patterns corresponding to capacitors coupled to one of the ground electrodes and between the input and output electrodes to be parallel to corresponding ones of the resonators.

BRIEF DESCRIPTION OF THE DRAWINGS

These and/or other aspects and advantages of the invention will become apparent and more readily appreciated from the following description of the preferred embodiments, taken in conjunction with the accompanying drawings of which.

DETAILED DESCRIPTION OF THE PREFERRED EMBODIMENTS

Figure 1:
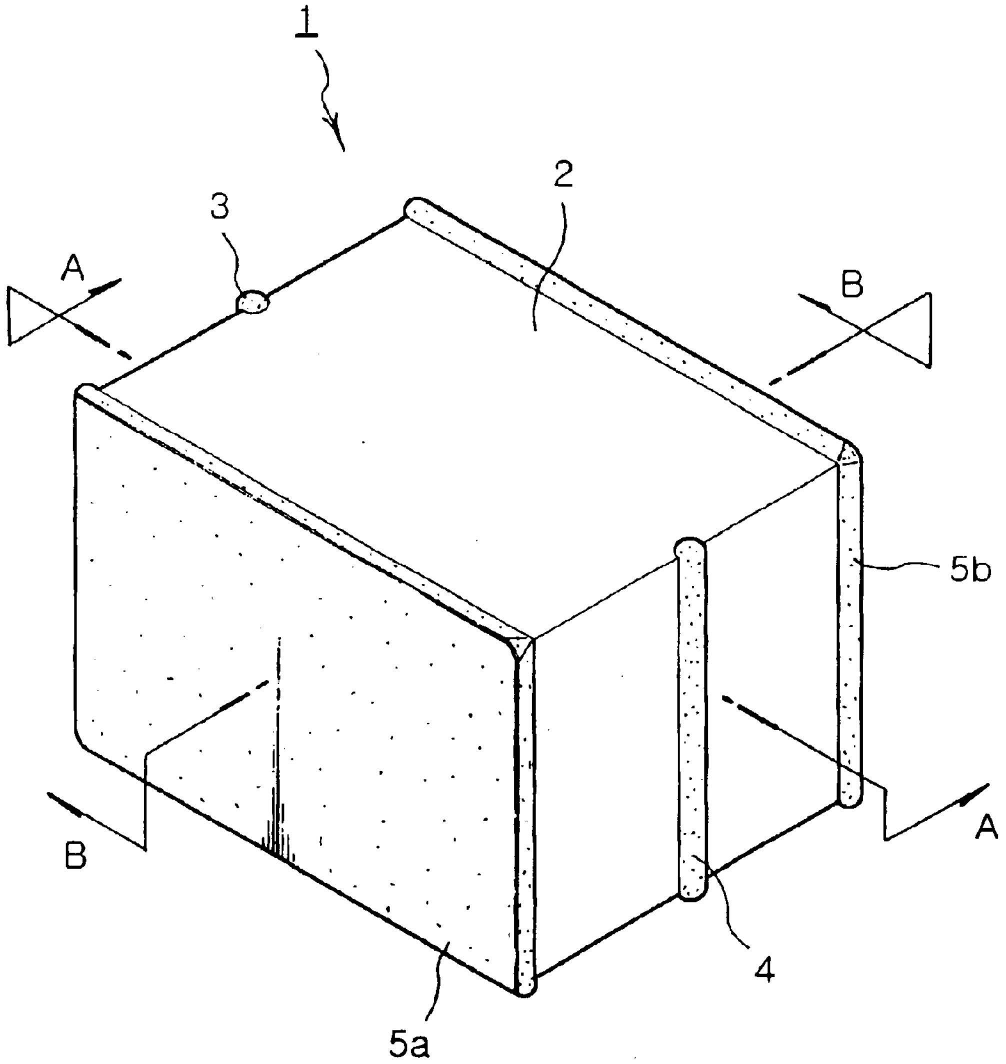
PRIOR ART FIG. 1
FIG. 1 is a prospective view of a conventional dielectric laminated filter.
Figure 2A:
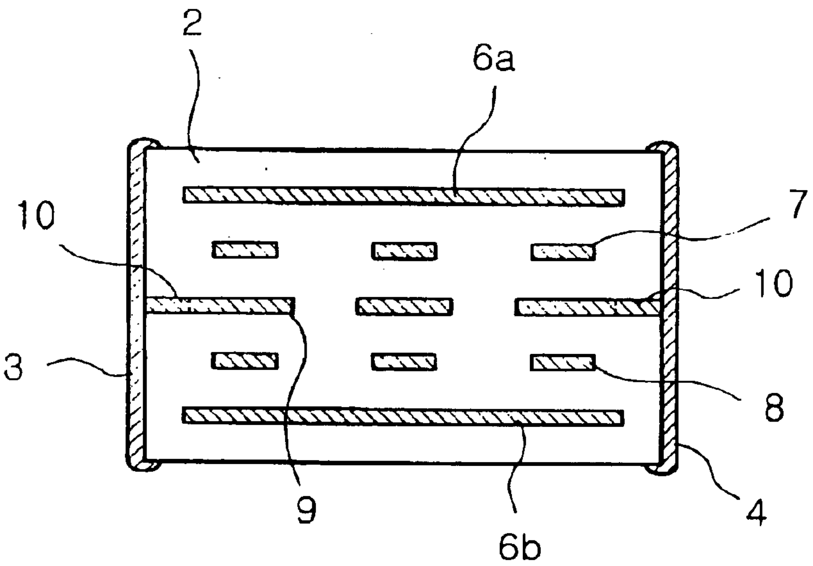
PRIOR ART FIG. 2a
FIGS. 2A and 2B are cross-sectional views taken along lines A—A and B—B of FIG. 1, respectively.
Figure 2B:
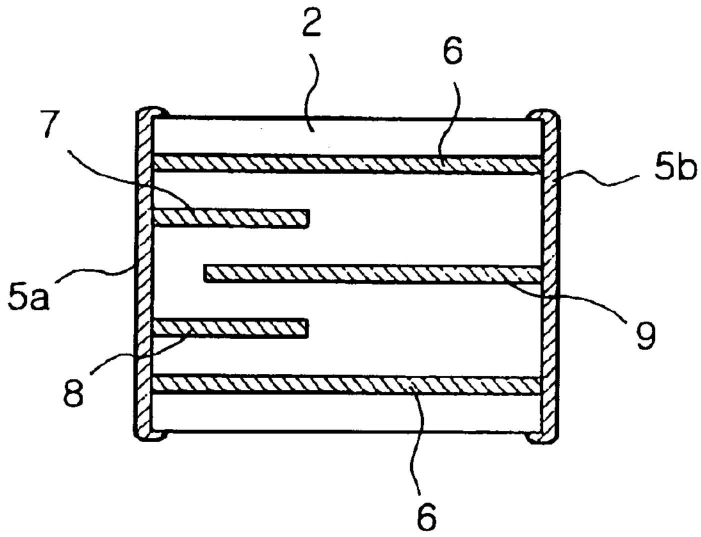
PRIOR ART FIG. 2b

Reference will now be made in detail to the present preferred embodiments of the present invention, examples of which are illustrated in the accompanying drawings, wherein like reference numerals refer to the like elements throughout. The embodiments are described below in order to explain the present invention by reference to the figures.

Figure 5:
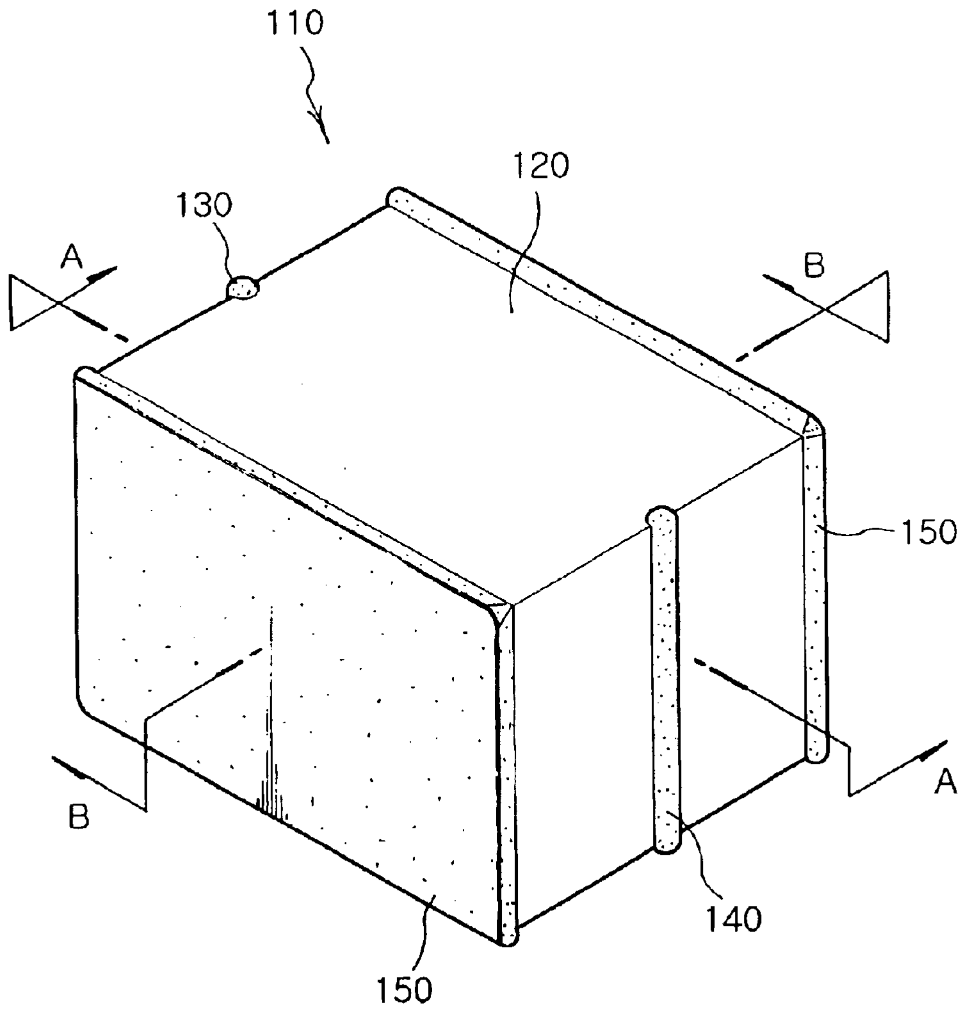
FIG. 5 is a perspective view of a dielectric laminated filter according to an embodiment of the present invention.

FIG. 5 is a perspective view of a dielectric laminated filter 110 according to an embodiment of the present invention. The dielectric laminated filter 110 includes a dielectric block 120 having a hexahedron and laminated with a plurality of dielectric sheets, ground electrodes 150 formed on front and rear sides (first sides) of the dielectric body 120, and input and output electrodes 130, 140 formed on left and right sides (second sides) of the dielectric body 120. Although an exterior feature of the dielectric laminated filter is similar to a conventional dielectric laminated filter, internal structures of the dielectric laminated filter 110 are different from the conventional dielectric laminated filter.

Figure 6:
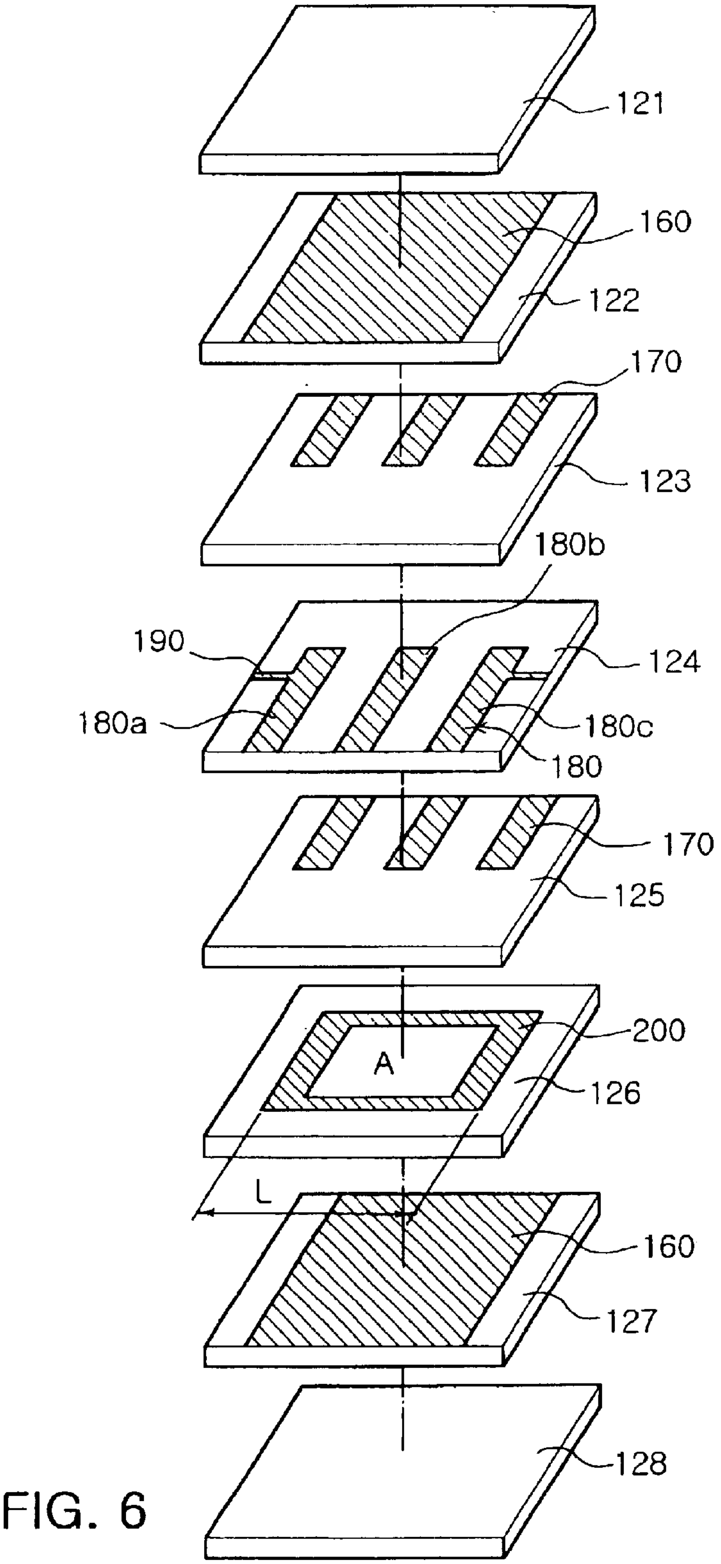
FIG. 6 is an exploded view of the dielectric laminated filter shown in FIG. 5.

FIG. 6 is an exploded view of the dielectric laminated filter shown in FIG. 5 and shows characteristics of the present invention. Referring to FIG. 6, the dielectric laminated filter 110 includes a first outside dielectric sheet 121 disposed on an uppermost portion, i.e., an inside portion of upper and lower sides (third sides), of the dielectric body 120 and not formed with any electrode pattern, a first ground dielectric sheet 122 disposed under the first outside dielectric sheet 121 to have an internal ground pattern 160 printed to be coupled to front and rear sides ground electrodes 150, a first capacitor dielectric sheet 123 disposed under the first ground dielectric sheet 122 to have three capacitor (capacitance) patterns 170 coupled to the rear side ground electrode 150, a resonator dielectric sheet 124 disposed under the first capacitor dielectric sheet 123 to have three resonator (resonance) patterns 180 (180*a,* 180*b,* 180*c*) disposed parallel to one another and coupled to the front side ground electrode 150 and to have input and output patterns 190 coupling two resonator patterns 180*a,* 180*c* to the input and output electrodes 130, 140, respectively, a second capacitor dielectric sheet 125 disposed under the resonator dielectric sheet 124 to have the three capacitor patterns 170 coupled to the rear side ground electrode 150 and disposed parallel to one another, an inductor dielectric sheet 126 disposed under the second capacitor dielectric sheet 125 to an inductor (inductance) pattern 200 having a rectangular loop shape, a second ground dielectric sheet 127 disposed under the inductor dielectric sheet 126 to have the internal ground pattern 160 coupled to the front and rear side ground electrodes 150, and a second outside dielectric sheet 128 disposed under the second ground dielectric sheet 127 to form a lowermost portion, i.e., the other inside portion of the upper and lower sides (the third sides), of the dielectric body 120 without having any electrode pattern. Respective sheets of the dielectric body 120 have a corresponding predetermined thickness.

Figure 7:
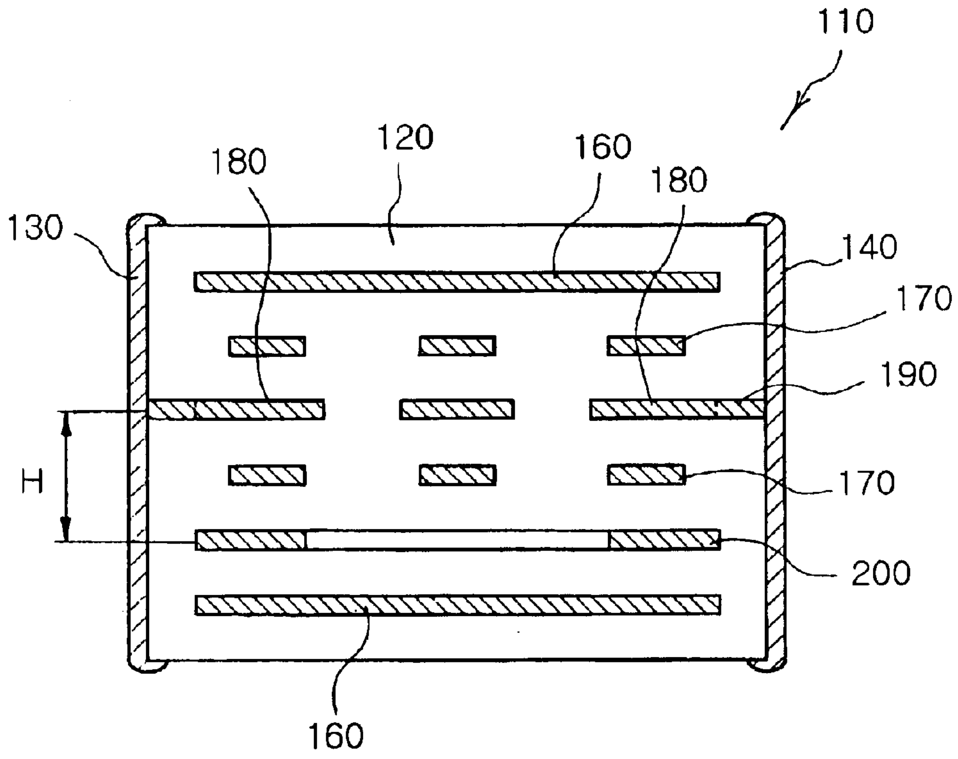
FIG. 7 is a cross-sectional view taken along a line A—A of FIG. 5.

FIG. 7 is a cross-sectional view taken along a line A—A of FIG. 5 to describe the internal structure of the dielectric laminated filter 110. Referring to FIG. 7, in an inside of the dielectric block 120, the inductor pattern 200 is disposed to be spaced-apart from the resonator pattern 180 by a height H and to be parallel to the resonator pattern 180. The capacitor pattern 170 formed between the resonator pattern 180 and the inductor pattern 200 may be omitted. This will be described later.

Figure 8:
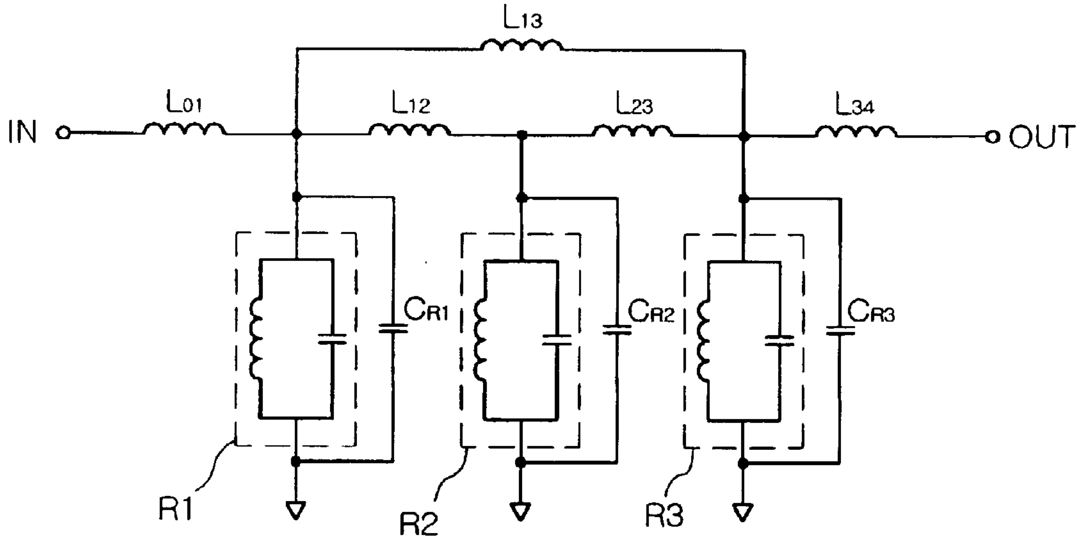
FIG. 8 is an equivalent circuit diagram of the dielectric laminated filter shown in FIGS. 5 and 6.

FIG. 8 is an equivalent circuit diagram of the dielectric laminated filter shown in FIGS. 5 and 6. Referring to FIG. 8, the resonator patterns 180 (180*a,* 180*b,* 180*c*) form resonators R1, R2, R3 coupled to a ground at their one end, and the capacitor patterns 170 disposed above and below the resonator patterns 180 (180*a,* 180*b,* 180*c*) and parallel to the resonator patterns 180 (180*a,* 180*b,* 180*c*) form capacitors CR1, CR2, CR3 coupled to resonators R1, R2, R3 to be parallel to the resonators R1, R2, R3. Respective electronic couplings between input and output electrodes 130, 140 and the resonator patterns 180 (180*a,* 180*b,* 180*c*) and between the resonator patterns 180 (180*a,* 180*b,* 180*c*) form a plurality of inductance couplings (inductors) L01, L02, L03, L04.

The inductor pattern 200 induces the inductance coupling L13 formed between the resonators R1, R3 of the resonator patterns 180*a,* 180*c* coupled to the input and output electrodes 130, 140, respectively, to form an attenuation pole to be disposed near a transmitting frequency band of the dielectric laminated filter 110. The inductor pattern 200 has a length L and an area A. The inductance coupling L13 is increased in proportion to an increase of the area A of the inductor pattern 200 to shift a location of the attenuation pole toward the transmitting frequency band. Since the area A is proportional to the length L, the inductance coupling L13 is also increased in proportion to an increase of the length L of the inductor pattern 200.

An inductance formed between the resonator patterns 180*a,* 180*c* by the inductor pattern 200 is inverse proportional to the height H from the resonator pattern 180 to the inductor pattern 200. That is, when the inductor pattern 200 becomes closer to the resonator pattern 180, the inductance formed between the resonator patterns 180*a,* 180*c* by the inductor pattern 2 is increased.

When the inductance formed between the resonator patterns 180*a,* 180*c* by the inductor pattern 2 is increased, the attenuation pole, which is disposed on a right side (a high frequency portion) of the transmitting frequency band in a filter response curve graph, is moved toward the transmitting frequency band.

Therefore, the filter characteristic of the dielectric laminated filter can be adjusted to various user demands according to the area A of the indictor pattern 200 and the height H between the resonator pattern 180 and the inductor pattern 200.

Although the inductor pattern 200 is disposed under the resonator pattern 180, the invention is not limited thereto. The inductor pattern 200 may be formed to be disposed above the resonator pattern 180, under the resonator pattern 180, or the same plane as the resonator pattern 180.

Since the inductance coupling L13 relating to a shift of the attenuation pole with respect to the transmitting frequency band is inverse proportional to the height H between the resonator pattern 180 and the inductor pattern 200, the inductor pattern 200 can be disposed on any plane when the inductor pattern 200 is parallel to the resonator pattern 180, and the height H exists between the inductor pattern 200 and the resonator 180.

The inductor pattern 200 induces a magnetic coupling between the resonator 180*a* coupled to the input electrode 130 and the resonator pattern 180*c* coupled to the output electrode 140, and the inductance coupling L13 is increased when the number of sides of the rectangular loop shape facing the resonator 180*a* coupled to the input electrode 130 and the resonator pattern 180*c* coupled to the output electrode 140, respectively, is increased. The number of filter sections corresponding to the resonator dielectric sheet is not limited but can be increased to increase the number of the resonators according to the present invention.

Figure 9:
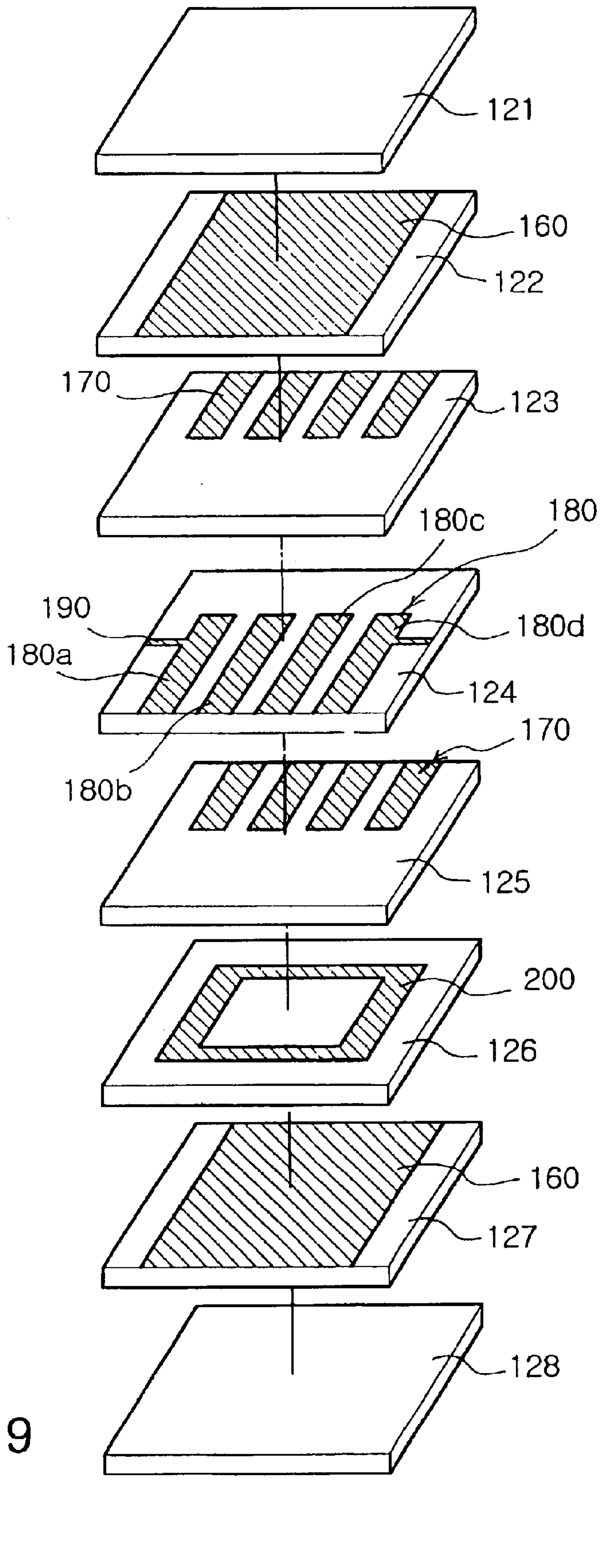
FIG. 9 is an exploded view of another example of the dielectric laminated filter according to another embodiment of the present invention.

FIG. 9 is an exploded view of another example of the dielectric laminated filter having four resonators according to another embodiment of the present invention. Other structures of the dielectric laminated filter are the same except the number of resonator patterns 180 (180*a,* 180*b,* 180*c,* 180*d*) and the inductor pattern 200, which includes two opposite sides corresponding to the resonator patterns 180*a,* 180*d* coupled to the input and output patterns 190 and is disposed to be spaced-apart from the resonator patterns 180 (180*a,* 180*b,* 180*c,* 180*d*) by a predetermined distance and to be parallel to the resonator patterns 180 (180*a,* 180*b,* 180*c,* 180*d*).

A shape of the inductor pattern 200 may be changed to another shape 201, 202, 203, 204 as shown in FIGS. 10 through 13.

Figure 10:
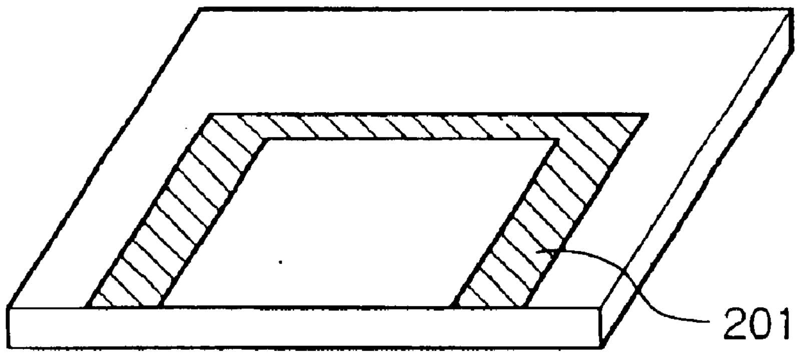
FIGS. 10 through 13 are views showing examples of an inductor pattern used in the dielectric laminated filter shown in FIG. 5.

The inductor pattern 201 of FIG. 10 has a shape of "⊓". Both distal ends of the "⊓" shape of the inductor pattern 201 are coupled to the ground electrode 150. A closed loop is formed between the inductor pattern 201 and the ground pattern, since both distal ends of the "⊓" shape of the inductor pattern 201 are electrically coupled to the ground electrode 150. The inductor pattern 201 induces the inductance coupling between the resonator patterns (180*a* and 180*c* of FIG. 6, or 180*a* and 180*d* of FIG. 9).

Figure 11:
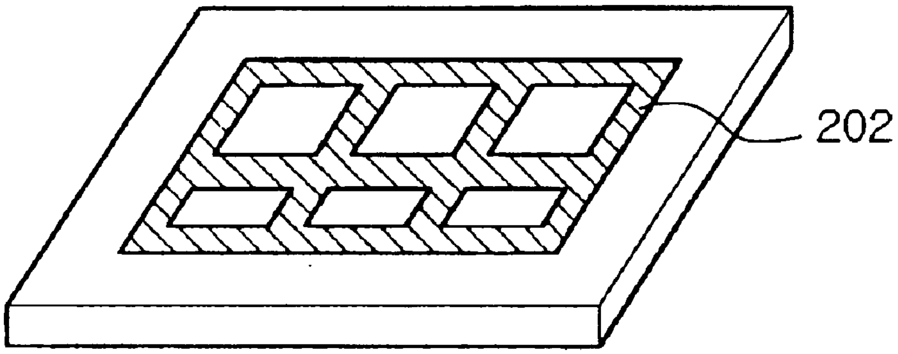

The inductor pattern 202 of FIG. 11 has a checkered pattern having a plurality of spaces therein to perform the same function as the inductor pattern 200 of FIGS. 5 and 6.

Figure 12:
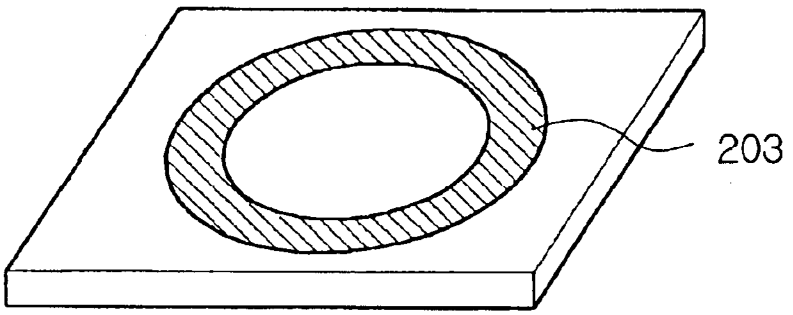
Figure 13:
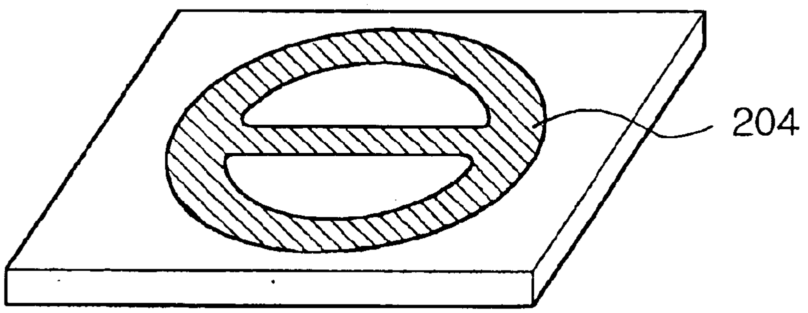

The inductor pattern 200 is not limited to the rectangular loop shape. Any shape can be used in the inductor pattern 200 when inducing the inductance coupling between the resonator pattern 180 coupled to the input electrode 130 and the resonator pattern coupled to the output electrode 140. The shape can be a circular closed loop 203 as shown in FIG. 12, or a θ shape 204 having middle portions of the circular closed loop coupled to each other as shown in FIG. 13.

At least two portions of the shape face the resonator pattern 180*a* of FIGS. 6 and 9 coupled to the input electrode 130 and the resonator pattern 180*c* of FIG. 6 or 180*d* of FIG. 9 coupled to the output electrode 140 to generate the inductance coupling.

Figure 3:
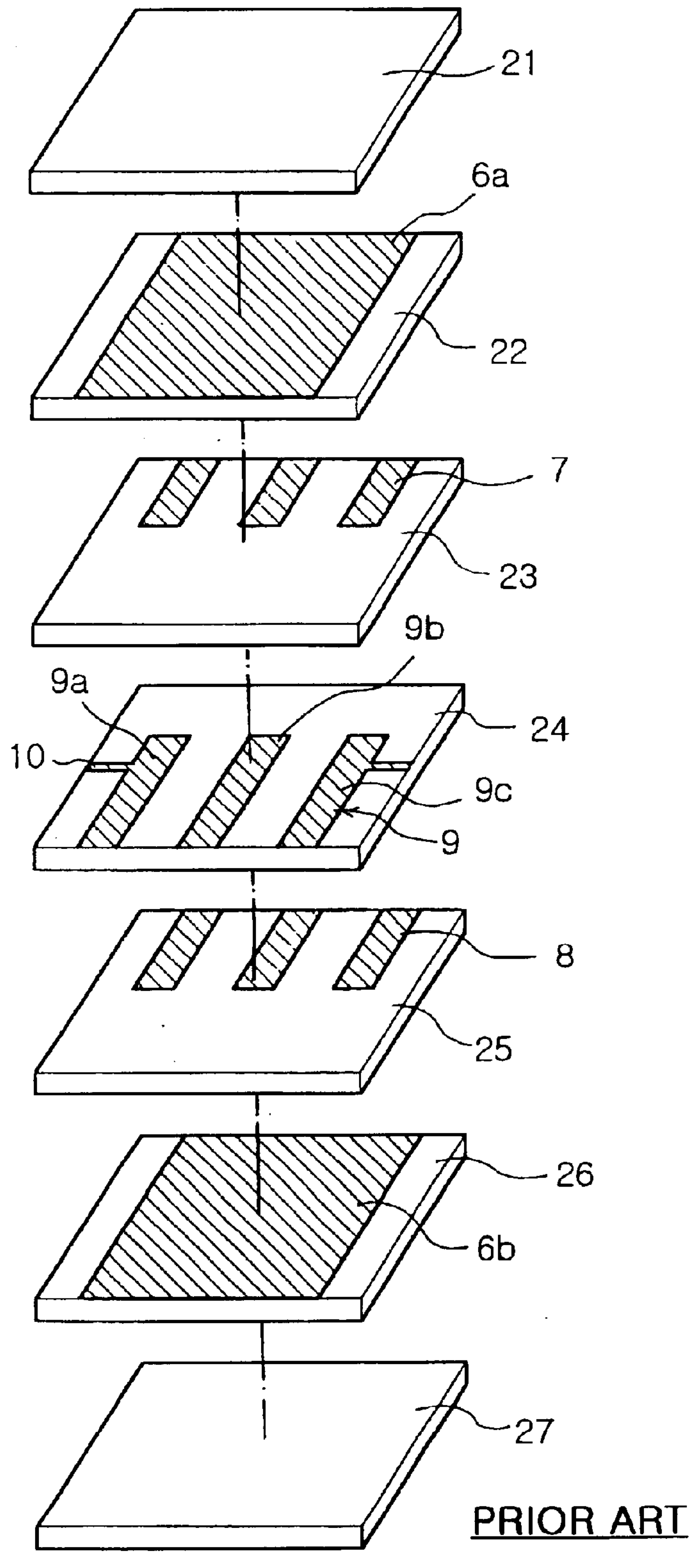
FIG. 3 is an exploded view of pattern structures of the dielectric laminated filter shown in FIG. 1.
Figure 4:
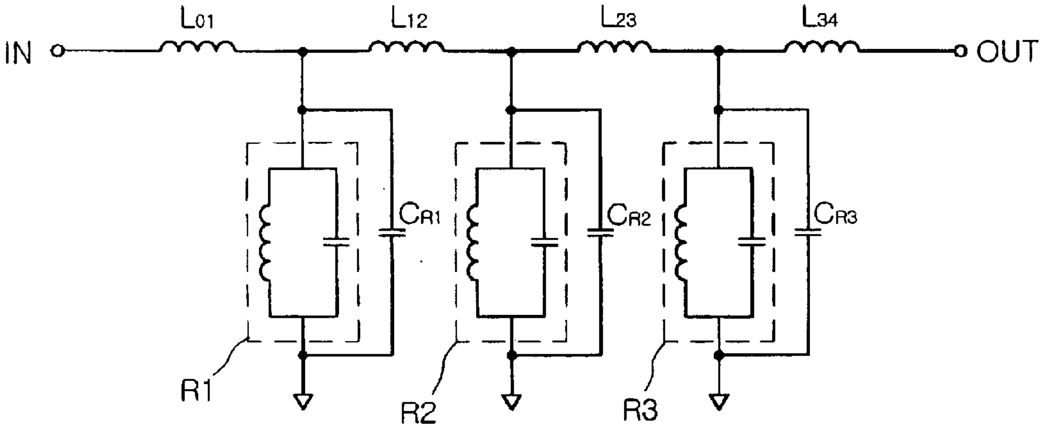
PRIOR ART FIG. 4
FIG. 4 is an equivalent circuit diagram of the dielectric laminated filter shown in FIG. 1.
Figure 20:
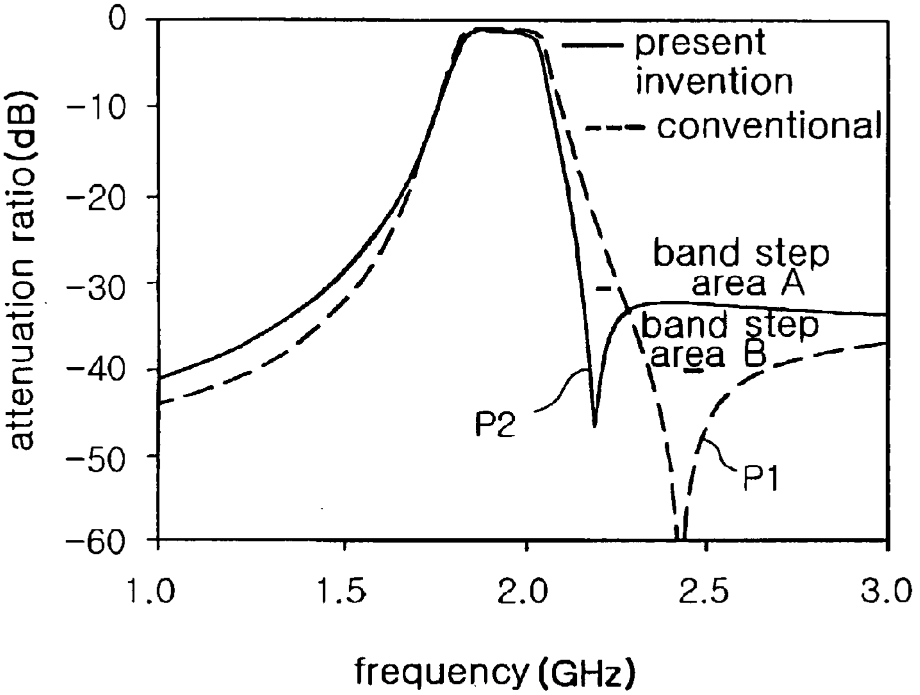
FIG. 20 is a graph showing characteristics of the dielectric laminated filter shown in FIG. 5.

The filter characteristic of the dielectric laminated filter 110 having the above structure is shown in FIG. 20 compared to a conventional dielectric laminated filter. FIG. 20 is a graph showing response characteristics of the dielectric laminated filter of FIG. 6 and the conventional dielectric laminated filter shown in FIG. 3. A first graph indicated by a dotted line is the response characteristic graph of the conventional dielectric laminated filter, and a second graph indicated by a solid line is the response characteristic graph of the dielectric laminated filter 110 according to present invention.

According to the graphs of FIG. 20, in the dielectric laminated filter 110, an attenuation pole P2 formed by the inductor pattern 200 is disposed to be closer to the transmitting frequency band than an attenuation pole P1 of the conventional dielectric laminated filter.

In addition, since an amount of the inductance coupling L13 can be adjusted when the height H of the inductor pattern 200 from the resonator pattern 180 is adjusted, the dielectric laminated filter 110 can be manufactured according to the various user demands.

As shown in FIG. 20, the dielectric laminated filter has an ideal frequency response characteristic compared to the conventional dielectric laminated filter since the attenuation pole is disposed closer to the transmitting frequency band.

A location and a size of the attenuation pole vary according to the area A of the inductor pattern 200 and the height of the resonator pattern 180 from the inductor pattern 200. The inductor pattern 200 described above can be used in any type of the dielectric laminated filter.

FIGS. 14 through 18 show various types of the dielectric body which can be used in the dielectric laminated filter 110, and different types of inductor patterns can be used in the various types of the dielectric body. In FIGS. 14 through 18, the same elements having the same function as the above embodiment refer the respective corresponding reference numerals.

Figure 14:
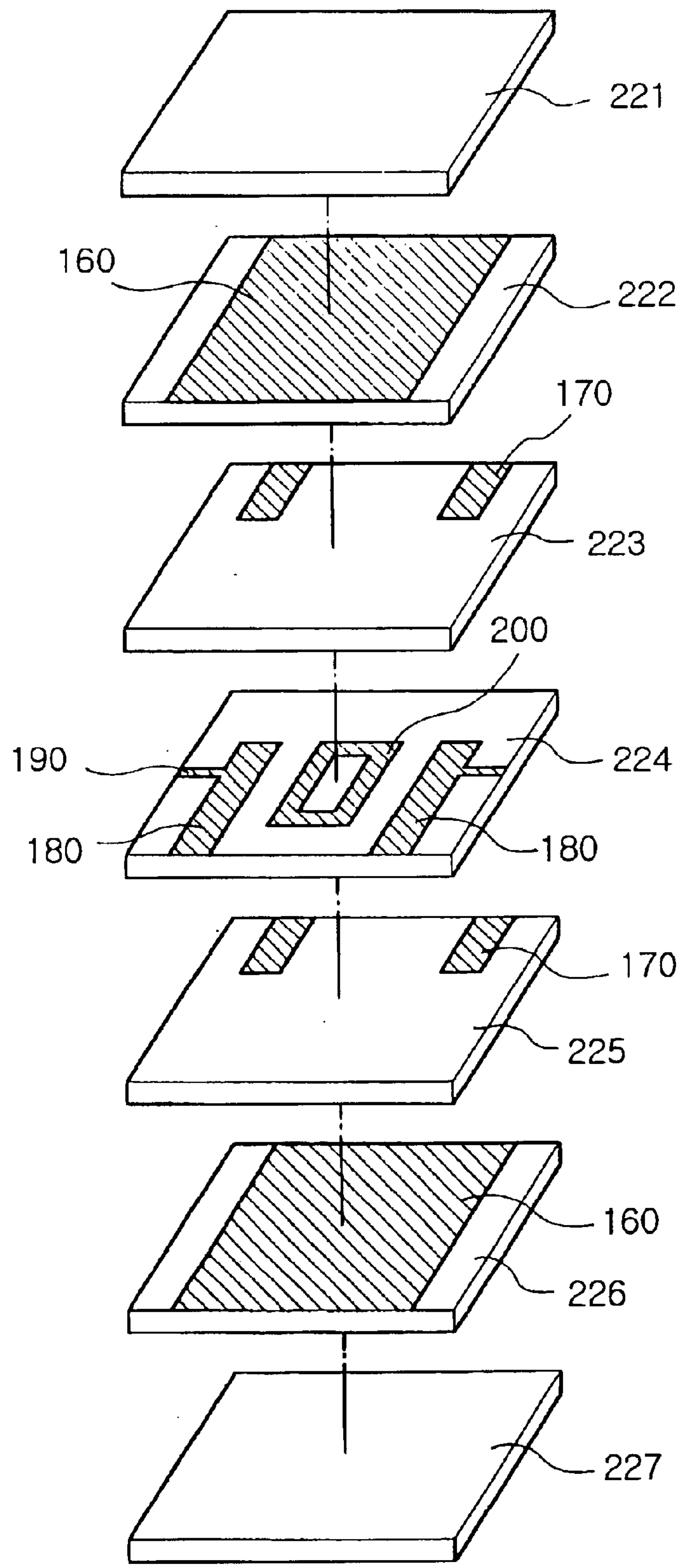
FIG. 14 is an exploded view of another example of the dielectric laminated filter having two resonators according to another embodiment of the present invention.

FIG. 14 is an exploded view of another example of the dielectric laminated filter having two resonators according to another embodiment of the present invention. The internal ground pattern 160, the capacitor pattern 170, the resonator pattern 180, and the input and output pattern 190 are the same as the previously described corresponding ones, and the dielectric laminated filter includes the first outside dielectric sheet 221, the first ground dielectric sheet 222, the first capacitor dielectric sheet 223, the resonator dielectric sheet 224, the second capacitor dielectric sheet 225, the second ground dielectric sheet 227, and the second outside dielectric sheet 228. The inductor pattern 200 is disposed on the resonator dielectric sheet 224 and between the resonator patterns 180 to induce the inductance coupling with the resonator patterns 180.

Figure 15:
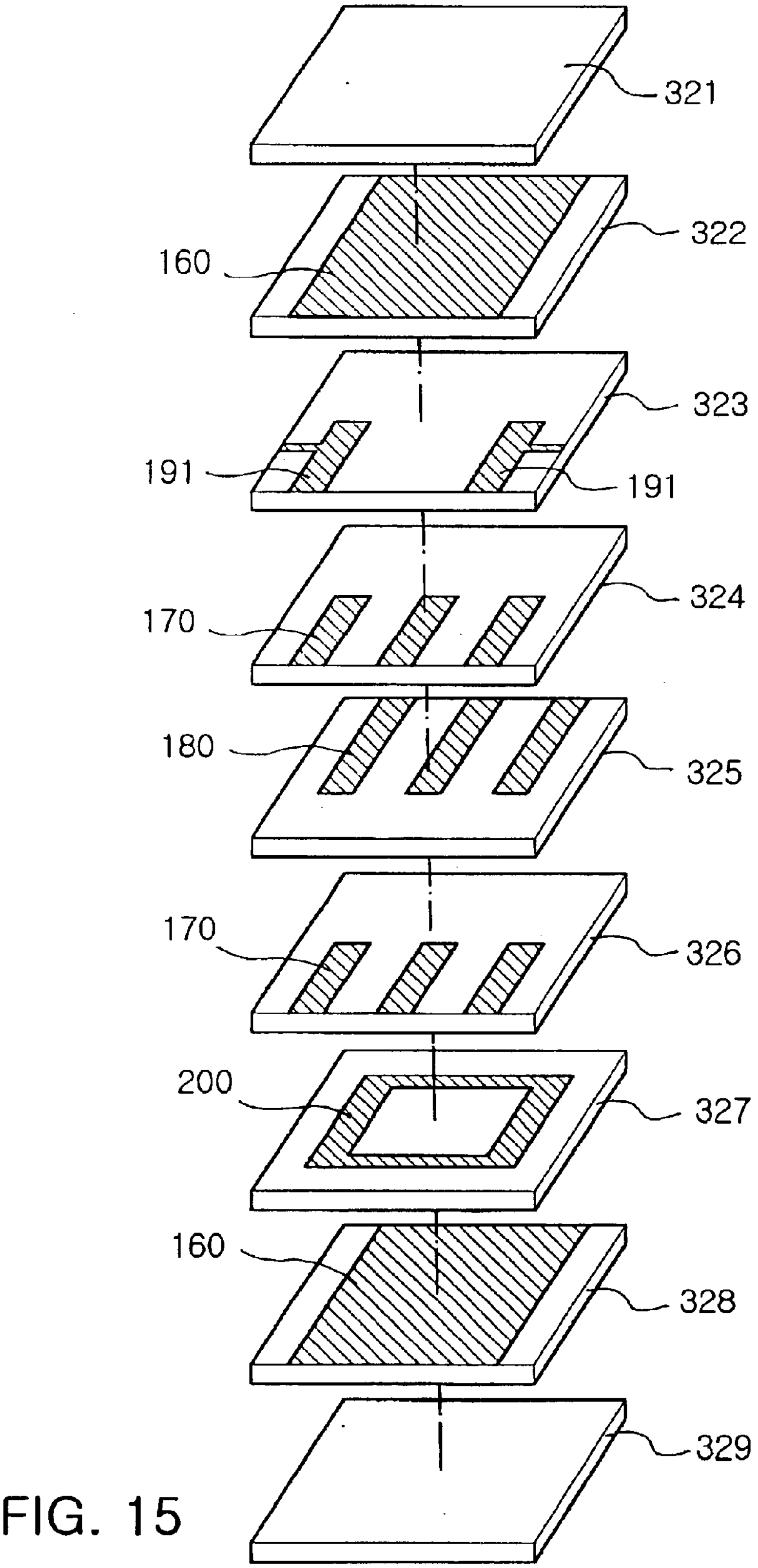
FIG. 15 is an exploded view of another example of the dielectric laminated filter having an impedance transformer as input/output electrodes.
Figure 16:
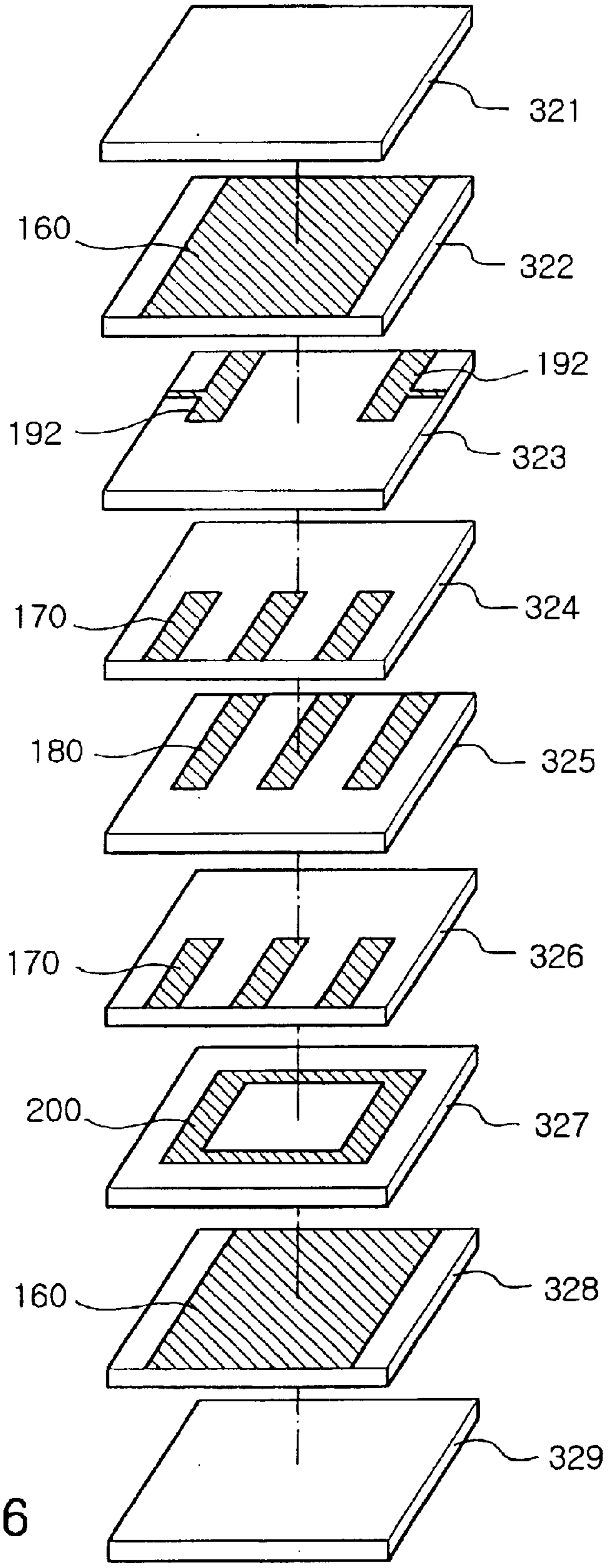
FIG. 16 is an exploded view of another example of the dielectric laminated filter having another impedance transformer as the input/output electrodes.

FIGS. 15 and 16 are an exploded view of the dielectric laminated filter having an impedance transformer as input/output electrodes. The dielectric laminated filter includes the first outside dielectric sheet 321, the first ground dielectric sheet 322, the first capacitor dielectric sheet 324, the resonator dielectric sheet 325, the second capacitor dielectric sheet 326, the inductor dielectric sheet 327, the second ground dielectric sheet 328, and the second outside dielectric sheet 329. The resonators 180 of FIG. 15 are not coupled to the input and output electrodes 130, 140 through the input and output patterns 190 as shown in FIG. 14. An impedance transformer 191 is formed on a different dielectric sheet 323 from the resonator dielectric sheet 224 to be coupled to the ground pattern 160 while facing the resonator pattern 180.

The impedance transformer 191 forms the impedance coupling with the resonator patterns 180 to transmit a high frequency signal from the input electrode 130 to the output electrode 140.

The inductor pattern 200 is disposed under the resonator pattern 180 by the height H regardless the impedance transformer 191 to induce the inductance coupling with the resonators 180 coupled to the input and output electrodes 130, 140.

Figure 17:
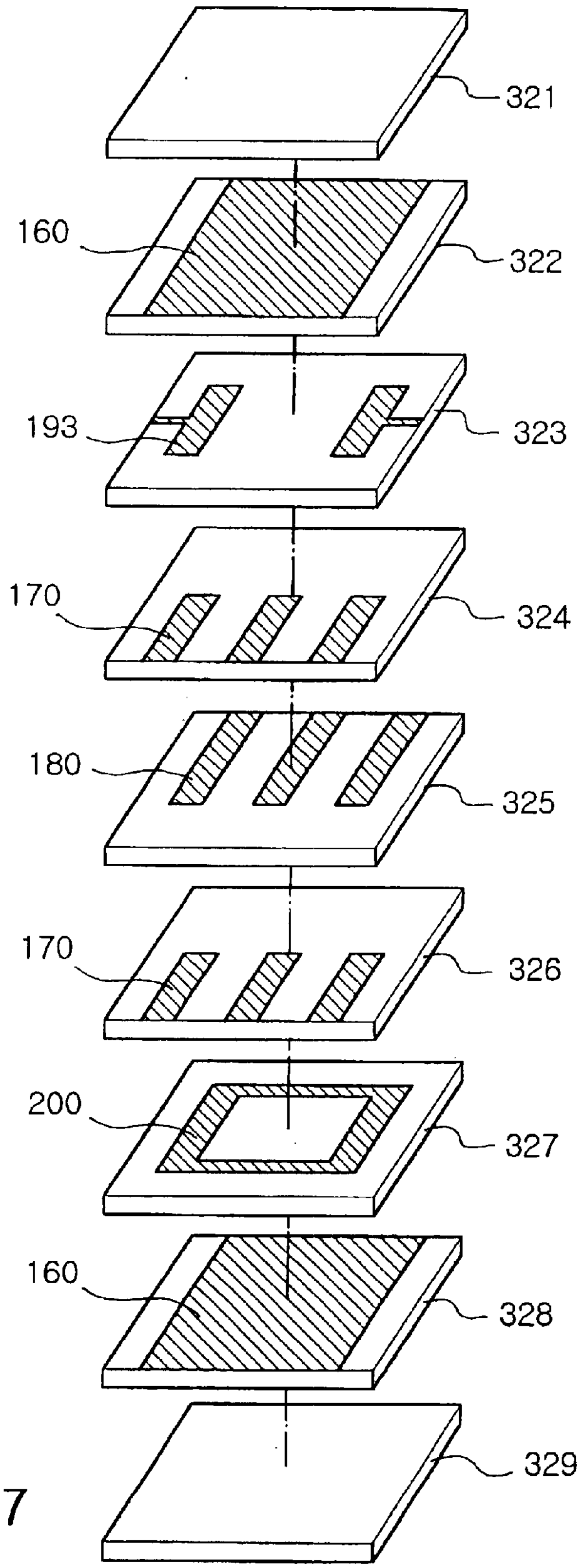
FIG. 17 is an exploded view of another example of the dielectric laminated filter having a capacitor pattern as the input/output electrodes.

FIG. 17 is an exploded view of another example of the dielectric laminated filter having a capacitor pattern 193 as the input/output electrodes 130, 140. Regardless of the capacitance pattern 193, the inductance pattern 200 is disposed to face the respective resonator patterns 180 coupled to the input and output electrodes 130, 140 to induce the inductance coupling with the resonator patterns 180.

Figure 18A:
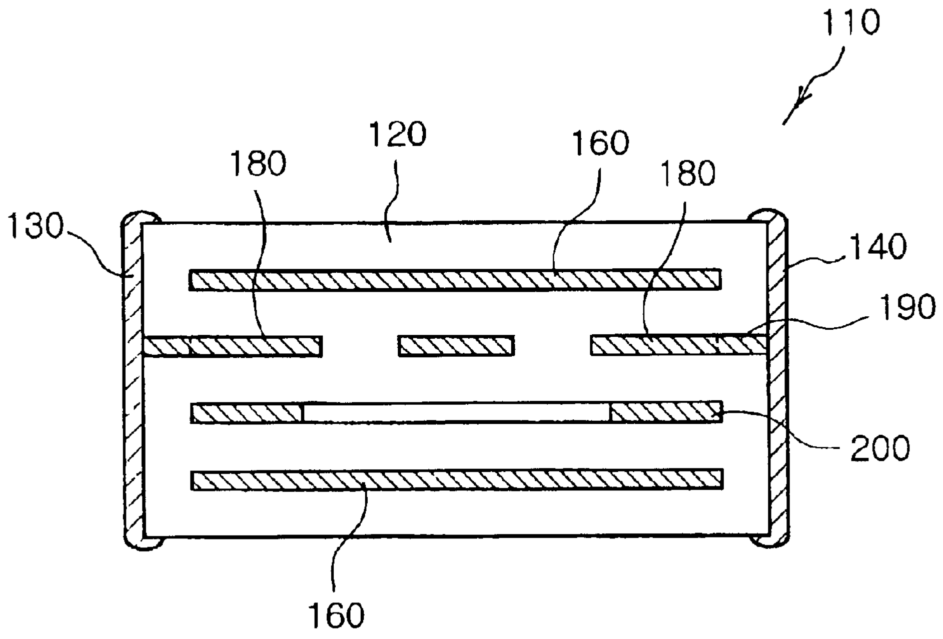
FIGS. 18A and 18B are cross-sectional views taken along lines A—A and B—B of FIG. 5, respectively.
Figure 18B:
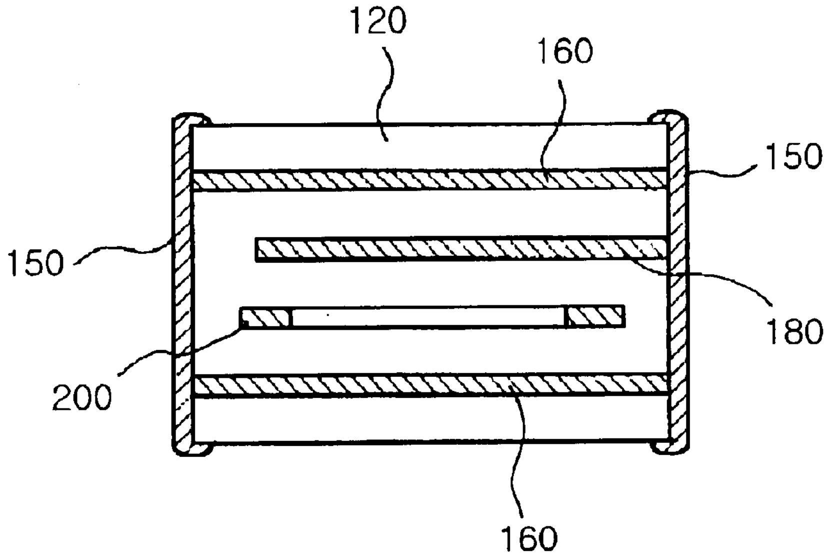

FIGS. 18A and 18B are cross-sectional views taken along lines A—A and B—B of FIG. 5, respectively, to show dielectric laminated filter not having the capacitor pattern 170. The inductor pattern 200 is formed between the resonator pattern 180 and the ground pattern 160. The inductor pattern 200 is one of the rectangular loop shape, a rectangular hook shape, a circular shape, and a checkered pattern.

Figure 19:
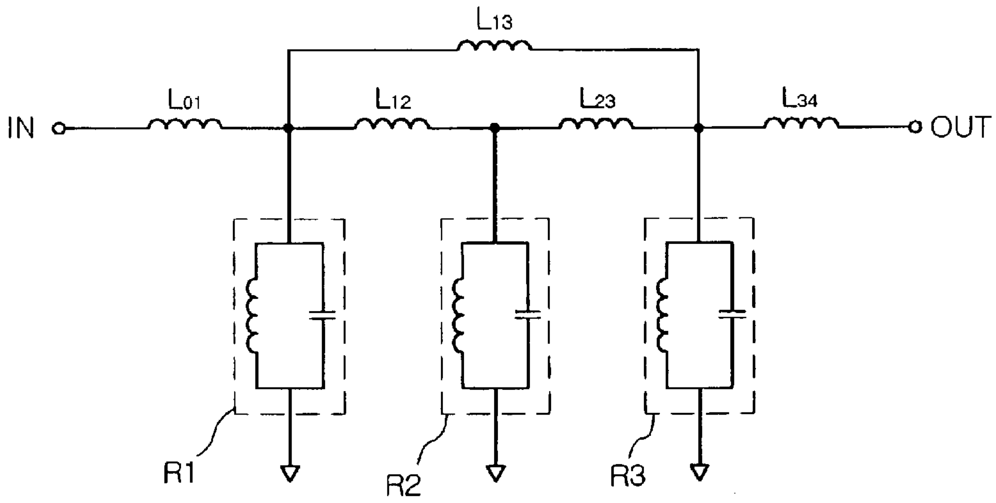
FIG. 19 is an equivalent circuit diagram of the dielectric laminated filter shown in FIGS. 18A and 18B.

FIG. 19 is an equivalent circuit diagram of the dielectric laminated filter shown in FIGS. 18A and 18B. The resonator patterns 180 form the resonators R1, R2, R3, and the inductance coupling L01, L12, L23, L34 is coupled between the input electrode 130 and the output electrode 140. The inductance coupling L13 is formed between the resonators R1 and R3 coupled to the input and output electrodes 130, 140, respectively, by the inductor pattern 200 formed between the ground pattern 160 and the resonator pattern 180.

According to the inductance coupling L13, the attenuation pole is disposed close to the transmitting frequency band as shown in FIG. 20.

As described above, the inductor pattern is formed on, above, or under the resonator dielectric sheet to form the inductance coupling with the resonator patterns coupled to the input and output patterns, thereby improving the skirt characteristic of the dielectric laminated filter.

In addition, the inductor pattern can be adjusted to adjust the filter response characteristic according to the user demands.

Although a few preferred embodiments of the present invention have been shown and described, it would be appreciated by those skilled in the art that changes may be made in this embodiment without departing from the principle and sprit of the invention, the scope of which is defined in the claims and their equivalent.

What is claimed is:

1. A dielectric laminated filter comprising:

a dielectric block laminated with a plurality of dielectric sheets;

a plurality of ground electrodes formed on first sides of the dielectric block;

a plurality of input and output electrodes formed on second sides of the dielectric body to be separated from the ground electrodes;

a plurality of internal ground patterns each formed on an internal dielectric sheet of the dielectric block and coupled to the ground electrodes;

a plurality of resonator patterns disposed between the third sides of the dielectric block and having ends coupled to one of the ground electrodes; and an inductor pattern disposed to be spaced-apart from the resonator patterns, having a closed loop having at least one internal space, and forming an inductance coupling between the resonator patterns.

2. The filter of claim 1, wherein the resonator patterns are disposed on the same plane.

3. The filter of claim 1, wherein at least one of the resonator patterns is disposed on a first plane, and the other one of the resonator patterns is disposed on a second plane different from the first plane.

4. The filter of claim 1, wherein the resonator patterns are parallel to each other.

5. The filter of claim 1, wherein two of the resonator patterns are disposed adjacent to the input and output electrodes and comprises portions coupled to corresponding ones of the input and output electrodes.

6. The filter of claim 1, wherein the dielectric block comprises:

a plurality of capacitor patterns disposed above and under the resonator patterns to be coupled to the ground electrodes.

7. The filter of claim 6, wherein the capacitor patterns comprises:

first capacitor patterns formed above the resonator patterns and on the same plane; and second capacitor patterns formed under the resonator patterns and on the same plane.

8. The filter of claim 6, wherein the capacitor patterns comprises:

first capacitor patterns formed on a first plane; and second capacitor patterns formed on a second plane different from the second plane.

9. The filter of claim 6, wherein the number of the capacitor patterns disposed above and under the resonator patterns is the same as the number of the resonator patterns.

10. The filter of claim 6, wherein the capacitor patterns are disposed to be parallel to each other.

11. The filter of claim 6, wherein at least one part of the capacitor patterns is disposed on a line one which the resonator patterns is disposed.

12. The filter of claim 6, wherein the inductor pattern is disposed between the capacitor patterns and the internal ground patterns.

13. The filter of claim 1, wherein the inductor pattern is disposed on the same plane.

14. The filter of claim 1, wherein the inductor pattern is disposed under the resonator patterns.

15. The filter of claim 1, wherein the inductor patterns is disposed above the resonator patterns.

16. The filter of claim 1, wherein the inductor patterns is disposed above and under the resonators.

17. The filter of claim 1, wherein the inductor patterns is disposed on a plane on which the resonator patterns are disposed.

18. The filter of claim 17, wherein the inductor pattern is disposed between the resonator patterns corresponding to the input and output electrodes.

19. The filter of claim 1, wherein the dielectric block comprises:

a plurality of capacitor patterns disposed above and under the resonator patterns and coupled to the ground electrodes; and a plurality of impedance patterns disposed on a plane on which the capacitor patterns and the resonator patterns are not disposed, disposed to correspond to input and output electrodes, and having first ends coupled to one of the ground electrodes and second ends coupled to the input and output electrodes, respectively.

20. The filter of claim 19, wherein the impedance patterns are disposed between the internal ground patterns and the capacitor patterns.

21. The filter of claim 1, wherein the inductor pattern has a rectangular loop shape.

22. The filter of claim 1, wherein the inductor pattern has a checkered shape having a plurality of inside spaces.

23. The filter of claim 1, wherein the inductor pattern has a circular closed loop shape.

24. The filter of claim 1, wherein the inductor pattern has a shape of $\theta$.

25. The filter of claim 1, wherein the inductor pattern has an area and a length, the inductor pattern generates an inductance coupling with the resonator patterns coupled to the input and output electrodes, and the inductance coupling varies according to the the area and the length of the inductor pattern.

26. A dielectric laminated filter comprising:

a dielectric block laminated with a plurality of dielectric sheets;

a plurality of ground electrodes formed on first sides of the dielectric block;

a plurality of input and output electrodes formed on second sides of the dielectric body to be separated from the ground electrodes;

a plurality of internal ground patterns each formed on an inside portion of third sides of the dielectric block and coupled to the ground electrodes;

a plurality of resonator patterns disposed between the third sides of the dielectric block and having ends coupled to one of the ground electrodes;

a plurality of capacitor patterns disposed above/below the resonator patterns and having ends coupled to the input and output electrodes; and an inductor pattern disposed to be spaced-apart from the resonator patterns, having a shape of ⊓, having ends of the ⊓ shape coupled the ground electrodes to form a closed loop to form an inductance coupling with the resonator patterns.

27. The filter of claim 26, wherein the resonator patterns are disposed adjacent to the input and output electrodes to be coupled to the input and output electrodes.

28. The filter of claim 26, wherein at least one of the capacitor patterns is disposed on a line on which the resonator patterns are disposed.

29. The filter of claim 26, wherein the inductor pattern comprises portions disposed to correspond to ones of the resonator patterns disposed adjacent to the input and output electrodes in a direction perpendicular to the internal ground patterns.

30. A dielectric laminated filter comprising:

a dielectric block laminated with a plurality of dielectric sheets;

a plurality of ground electrodes formed on first sides of the dielectric block;

a plurality of input and output electrodes formed on second sides of the dielectric body to be separated from the ground electrodes;

a plurality of internal ground patterns each formed on an inside portion of third sides of the dielectric block and coupled to the ground electrodes;

a plurality of resonator patterns disposed between the third sides of the dielectric block and having ends coupled to one of the ground electrodes;

a plurality of capacitor patterns disposed on a plane between the resonator patterns and one of the internal ground patterns, having ends coupled to the input and output electrodes, having the same number of the resonator patterns, and spaced-apart from the resonator patterns; and an inductor pattern disposed on one of the dielectric sheets on which the resonator patterns or the capacitor patterns are disposed, having a closed loop to form an inductance coupling with the resonator patterns.

31. The filter of claim 30, wherein at least one of the capacitor patterns is disposed on a line on which the resonator patterns are disposed.

32. The filter of claim 30, wherein the inductor pattern comprises portions disposed to correspond to ones of the resonator patterns disposed adjacent to the input and output electrodes in a direction perpendicular to the internal ground patterns.

33. A dielectric laminated filter comprising:

a dielectric block laminated with a plurality of dielectric sheets;

a plurality of ground electrodes formed on first sides of the dielectric block;

a plurality of input and output electrodes formed on second sides of the dielectric body to be separated from the ground electrodes;

a plurality of internal ground patterns each formed on an inside portion of third sides of the dielectric block and coupled to the ground electrodes;

a plurality of resonator patterns disposed between the third sides of the dielectric block and having ends coupled to one of the ground electrodes;

a plurality of capacitor patterns disposed on a plane between the resonator patterns and one of the internal ground patterns, having ends coupled to the input and output electrodes, having the same number of the resonator patterns, and spaced-apart from the resonator patterns; and an inductor pattern disposed on one of the dielectric sheets on which the resonator patterns or the capacitor patterns are disposed, disposed between the resonator patterns disposed adjacent to the input and output electrodes, spaced-apart from the resonator patterns by a distance, and having a closed loop to form an inductance coupling with the resonator patterns.

34. The filter of claim 33, wherein the inductor pattern comprises portions disposed to correspond to ones of the resonator patterns disposed adjacent to the input and output electrodes in a direction perpendicular to the internal ground patterns.

35. A dielectric laminated filter comprising:

a dielectric block laminated with a plurality of dielectric sheets;

a plurality of ground electrodes formed on first sides of the dielectric block;

a plurality of input and output electrodes formed on second sides of the dielectric body to be separated from the ground electrodes;

a plurality of internal ground patterns formed on an inside portion of third sides of the dielectric block and having ends coupled to corresponding ones of the ground electrodes;

a plurality of resonator patterns disposed between the third sides of the dielectric block and having ends coupled to one of the ground electrodes;

a plurality of capacitor patterns disposed on a plane between the resonator patterns and one of the internal ground patterns, having ends coupled to the input and output electrodes, having the same number of the resonator patterns, and spaced-apart from the resonator patterns;

an impedance transformer disposed on one of the dielectric sheets disposed between the capacitor patterns and one of the internal ground patterns, having two sub-patterns disposed adjacent to the input and output electrodes and having first ends coupled to one of the ground electrodes and second ends coupled to the input and output electrodes; and an inductor pattern disposed on one of the dielectric sheets on which the resonator patterns or the capacitor patterns are disposed, disposed between the resonator patterns disposed adjacent to the input and output electrodes, spaced-apart from the resonator patterns by a distance, and having a closed loop to form an inductance coupling with the resonator patterns.

36. The filter of claim 35, wherein the inductor pattern comprises portions disposed to correspond to ones of the resonator patterns disposed adjacent to the input and output electrodes in a direction perpendicular to the internal ground patterns.

* * * * *